United States Patent

[11] 3,613,008

[72] Inventor Kamil Y. Jabbar
River Grove, Ill.
[21] Appl. No. 824,864
[22] Filed May 15, 1969
[45] Patented Oct. 12, 1971
[73] Assignee Motorola Inc.
Franklin Park, Ill.

[54] OVERLOAD COMPENSATION CIRCUIT FOR ANTENNA TUNING SYSTEM

3 Claims, 1 Drawing Fig.

[52] U.S. Cl. .......... 325/319, 325/362, 325/374, 325/387, 334/15
[51] Int. Cl. .......... H04b 1/18
[50] Field of Search .......... 325/318, 319, 364, 374, 379, 383, 385, 387, 422, 454, 464, 451, 404; 334/11, 14, 15; 330/26, 29

[56] References Cited

UNITED STATES PATENTS

| | | | |
|---|---|---|---|
| 3,165,700 | 1/1965 | Birkenes .......... | 325/351 X |
| 3,192,491 | 6/1965 | Hesselberth et al. .......... | 325/387 X |
| 3,348,154 | 10/1967 | Fish, Jr. et al. .......... | 325/451 |
| 3,341,780 | 9/1967 | Sethna .......... | 325/319 X |

*Primary Examiner*—Benedict V. Safourek
*Attorney*—Mueller and Aichele

ABSTRACT: A radio receiver is supplied with signals from a high impedance capacitive antenna coupled in series with a low impedance resistive load in the form of the emitter-base circuit of a common-base RF transistor amplifier through a series-tuned circuit, including a varactor diode connected in series with an inductor. A source of DC biasing potential is provided to vary the biasing voltage on the diode in order to change its capacitance to tune the circuit over a predetermined band of frequencies. Overload compensation for the varactor diode is provided by utilizing the automatic gain control (AGC) voltage of the receiver, with the AGC voltage being applied to the base of the RF amplifier transistor to vary the biasing potential thereon. This in turn causes a corresponding variation in the impedance of the emitter-base path of the transistor with an increasing impedance being caused by increased signal levels. As a result, increasing amounts of the signal supplied by the antenna are dropped across the emitter-base path of the transistor at high signal levels, thereby limiting the RF signal level across the varactor diode to prevent rectification of high level signals thereby.

PATENTED OCT 12 1971 3,613,008
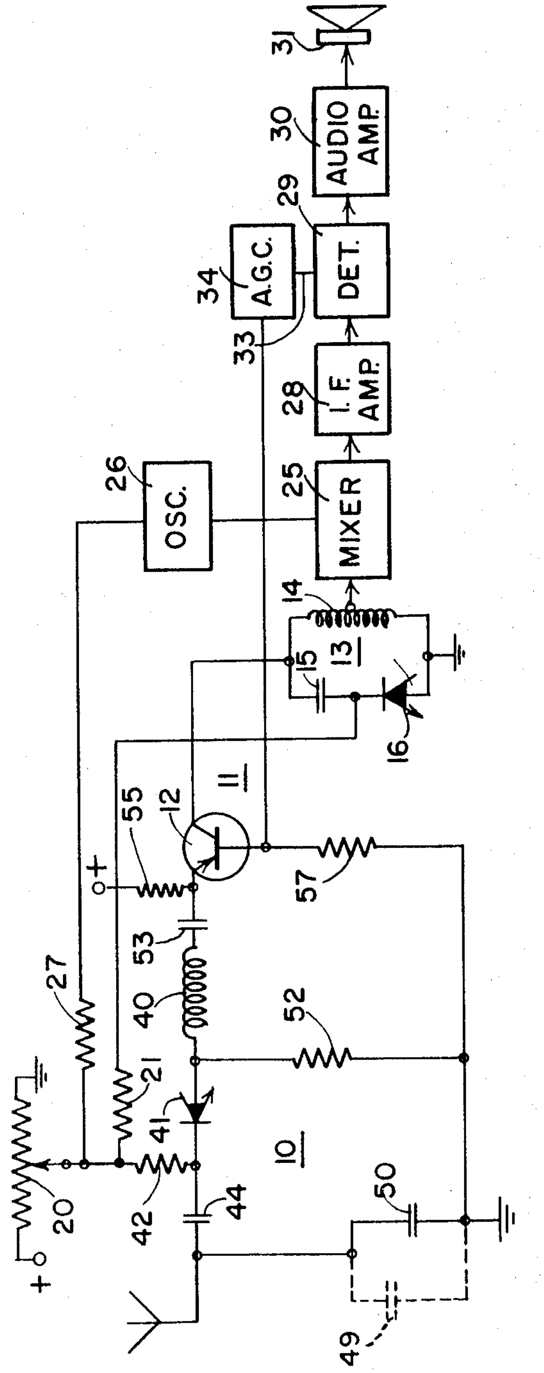
INVENTOR
KAMIL Y. JABBAR
BY
Mueller, Aichele & Rauner
ATTYS.

OVERLOAD COMPENSATION CIRCUIT FOR ANTENNA TUNING SYSTEM

BACKGROUND OF THE INVENTION

The use of voltage-variable, semiconductor diode capacitors for electronically tuning radio receivers has provided receiver designers with a wide latitude of design possibilities in the configurations which may be made in the receivers. This is especially desirable in the design of radio receivers for vehicular applications, where it is desirable to provide means for remotely tuning the radio receiver from one or more locations within the vehicle. The use of tuning circuits including voltage-variable diode capacitors has some disadvantages, however, especially when high level RF signals from strong stations are applied to the tuning circuit. Since the diode capacitor is a voltage controlled device, the characteristics of the diode capacitor respond to the level of the RF signals applied across it. When strong signals are applied across the diode capacitor, partial rectification of the signal by the diode capacitor occurs, causing a change in the DC bias on the diode. This then results in degradation of the circuit operation due to changes in the capacitance value of the reverse-biased diode capacitor, and detuning of the circuit occurs.

This problem is especially severe in the antenna stage, so that it is desirable to provide a means of preventing high signal levels from being applied across the voltage variable tuning capacitor used in the antenna tuning stage of the receiver.

SUMMARY OF THE INVENTION

It is an object of this invention to provide an overload compensation circuit for the voltage-variable reactance device used in an antenna tuning circuit.

It is an additional object of this invention to vary the input impedance of an RF amplifier connected in series with a series-tuned antenna tuning circuit including a voltage-variable capacitor in order to provide an overload compensation for the voltage-variable capacitor.

An antenna tuning circuit including a voltage-variable reactance is connected in series between an antenna and the input of an RF amplifier stage. Overload compensation for the voltage-variable reactance is provided by supplying a signal level responsive control voltage to the RF amplifier device to vary the input resistance of the RF amplifier stage in accordance with the control voltage, to thereby vary the signal level appearing across the voltage-variable reactance device in the tuning circuit.

BRIEF DESCRIPTION OF THE DRAWING

The sole FIGURE of the drawing is a schematic wiring diagram, partially in block form, illustrating a preferred embodiment of the invention.

DETAILED DESCRIPTION

Referring now to the drawing, there is shown an AM radio receiver circuit for receiving signals over an antenna 9, shown as a voltage generator and associated capacitance for a better understanding of the circuit, with the antenna being coupled through a series-tuned L–C circuit 10 to the input of an RF amplifier stage 11 including a common-base PNP transistor 12. The signals from the coupling circuit 10 are applied across the emitter-base path of the transistor 12 which has a tuned circuit 13 connected to its collector. The tuned circuit 13 consists of a tapped coil 14 with a blocking capacitor 15 and a voltage-variable tuning capacitor 16 connected in series across the coil 14. The voltage-variable capacitor 16 and the coil 14 form the resonant circuit for the RF amplifier transistor 12, and this circuit is tuned over a predetermined frequency range.

The voltage variable capacitor 16 is a two-terminal PN junction semiconductor device which exhibits a change in capacitance proportional to a change in the direct current reverse bias across the device. Voltage-variable capacitors or reactive devices of this type are well known, and an increase in the reverse bias voltage across such a capacitor causes its capacitance to decrease, thereby increasing the capacitive reactance. A decreased reverse bias results in the opposite effect, that is, the capacitance of the device increases and the capacitive reactance decreases. Devices which preferably may be used for the voltage-variable capacitor 16 are hyperabrupt varactor diodes since the hyperabrupt diodes exhibit great capacitance changes in response to the biasing voltage and thus are operable over a wide frequency range.

The biasing potential or tuning voltage for the voltage-variable capacitor 16 is obtained from the tap of a potentiometer 20 and is applied through an isolating resistor 21 to the junction between the voltage-variable capacitor 16 and the blocking capacitor 15. The potentiometer 20 may be located in the radio receiver itself or at a remote location and provides direct current potentials of varying amounts.

The selected radiofrequency signal obtained from the tap on the coil 14 of the tank circuit 13 is applied to one input of a mixer 25, and the other input of which receives signals from a local oscillator 26, which also may include a tuning circuit or tank circuit having a voltage-variable capacitor similar to the capacitor 16. The frequency of the oscillator tank circuit also may be controlled by the biasing potential obtained from the potentiometer 20 and applied through a coupling resistor 27 to the oscillator 26. The amplified RF signals are heterodyned with the local oscillator signals from the oscillator 26 by the mixer 25 to produce intermediate frequency signals. These IF signals then are amplified in an IF amplifier 28 and are detected in a detector stage 29, which supplies the signals to an audio amplifier 30, which in turn drives a speaker 31. An automatic gain control signal is obtained from the detector 29 in a conventional manner and is applied over a lead 33 to an AGC circuit 34, the output of which is applied to the base of the transistor 12 in the RF amplifier 11 in order to provide automatic gain control of the transistor 12.

In addition to the voltage-variable capacitor tuning devices in the RF tank circuit 13 and in the oscillator 26, the coupling circuit between the high impedance capacitive antenna 9 and the relatively low impedance emitter-base path of the transistor 12 includes a series tuned L–C circuit including an inductor 40 and another voltage-variable capacitor 41 as its principal elements. The output of the potentiometer 20 is applied through a third isolating resistor 42 to the junction of the voltage-variable capacitor 41 and a blocking capacitor 44. The capacitance of the capacitor 44 is chosen to be much greater than the capacitance of the other capacitors in the circuit; so that it has little affect on the AC signals present in the circuit, while serving to block any DC signals obtained from the potentiometer 20.

When the radio receiver is used in an automobile, the antenna and additional capacitance to ground exists, due primarily to the cable which connects the whip antenna to the radio receiver; and this capacitance is in the form of a shunt capacitance represented by a capacitor 49 shown connected in dotted lines between ground and the junction of the capacitor 44 and the antenna 9. In order to adjust the radio receiver system to cover the AM band of frequencies normally received by such a receiver, an additional shunt capacitance 50 also may be provided across the antenna output, and is shown as also being connected between ground and the junction of the capacitor 44 and the antenna 9. The value of the capacitance 50, when added to the capacitances of the antenna 9 and capacitor 49, forming a parallel combination in series with the capacitor 41, should provide the desired capacitance ratio needed to tune the AM band.

In order to provide a DC return path for the tuning voltage used to tune the voltage-variable capacitor 41, a high-impedance resistor 52 is connected between ground and the junction of the capacitor 41 and the inductor 40. The resistance of the resistor 52 is chosen to be very high, so that it appears essentially as an open circuit to any AC signals present in the circuit. To prevent the variable tuning voltage applied to the voltage-variable capacitor 41 from adversely affecting the operating level of the transistor 12, a second DC blocking capacitor 53 is provided between the inductor 40 and the emitter of the transistor 12. Like the capacitor 44, the blocking capacitor 53 also is chosen to have a capacitance substantially in excess of the other capacitors in the circuit so as to have substantially no affect on the AC signals present.

The DC operating level for the transistor 12 is obtained in a conventional manner by means of a resistor 55 connected between a source of positive potential and the emitter, and a resistor 57 is connected between the base of the transistor 12 and ground potential.

With this circuit, it is possible to tune the coupling circuit consisting of the inductor 40 and the voltage-variable capacitor 41 over a relatively wide range of resonant frequencies, while maintaining the bandwidth of the signal constant over the entire range, with constant power being coupled to the RF amplifier transistor 12. It has been found that when a hyperabrupt diode is employed for the capacitor 41, a frequency range of 435 kHz. to 1,620 kHz. may be tuned with a 10 kHz. bandwidth constant over the entire range.

When strong or high level AC signals are applied across a voltage-variable capacitor diode, such as the diode 41, there is a tendency for the diode to rectify or partially rectify the AC signals appearing thereacross. Such rectification of these AC signals then causes degradation in the operation of the circuit using the voltage-variable capacitor diode, due to detuning of the voltage-variable capacitor diode by the rectified DC which is present in addition to the normal DC biasing potential.

In order to provide compensation for AC overloads resulting from strong signal levels being obtained from the antenna 9, the emitter-base path of the transistor 12 is connected in series with the antenna tuning circuit including the diode 41; and the AGC voltage obtained from the AGC circuit 34 is applied to the junction of the base of the transistor 12 and the resistor 57, as stated previously. In addition to providing automatic gain control for the RF amplifier transistor 12, the AGC voltage acts, in effect, to change the input impedance of the transistor 12 to the RF signals, by changing the emitter-base impedance connected in series with the antenna tuning circuit 10.

When the AGC voltage increases in response to increased signal levels, the bias on the base of the transistor 12 is such as to cause the transistor 12 to conduct less. This appears as an increase in the effective input impedance of the emitter-base path of the transistor 12 insofar as the output of the antenna coupling circuit 10 is concerned. As a result, an increased RF voltage drop is present across the emitter-base path of the transistor 12; and the RF voltage across the voltage-variable capacitor 41 does not increase as the antenna input voltage increases. The RF voltage which appears across the voltage-variable capacitor diode 41 thus is limited to a value below that where the diode 41 would rectify or partially rectify the AC signals.

By connecting the RF amplifier transistor 12 so that the RF input signals from the series-tuned circuit 10 are applied to the emitter-base circuit of the RF transistor, it is possible to utilize the AGC voltage to perform a dual function in the circuit, namely, controlling the gain of the RF amplifier and, in addition, providing an increased series impedance to the RF signals for increasing signal levels. AS a result, the RF signals applied across the voltage variable capacitor diode 41 from the antenna 9 are held below a level at which the diode 41 is caused to rectify the signals.

I claim:

1. In a wave signal receiving apparatus having an antenna for receiving a wave signal, an RF amplifier stage including a transistor having output, input and control electrodes, and an antenna tuning circuit means electrically coupling the antenna and the input electrode of the transistor, the tuning circuit means including a voltage-variable capacitor and circuit means connected to the voltage-variable capacitor for applying a variable bias potential thereto to selectively tune the antenna-tuning circuit means to predetermined frequencies, an overload compensation circuit including in combination:

connecting means for connecting said voltage-variable capacitor of said antenna tuning circuit in series circuit between said antenna and the input electrode of said transistor;

an automatic gain control circuit coupled with the output electrode of said transistor for deriving an automatic gain control voltage corresponding to the magnitude of a received wave signal; and means for applying said automatic gain control voltage to the control electrode of said transistor to reduce the forward bias on said transistor for increased levels of output signals therefrom, thereby increasing the input impedance of said transistor to limit the voltage drop across said voltage-variable capacitor by causing an increased voltage drop to occur across the input/control electrode path of said transistor.

2. The combination according to claim 1 wherein said transistor has emitter, base and collector electrodes, corresponding to the input, control, and output electrodes, respectively, and is connected in a common base configuration, with said connecting means connecting the emitter of said transistor in a series circuit with said voltage-variable capacitor and said antenna, and with said automatic gain control voltage being applied to the base of said transistor, thereby varying the impedance of the emitter-base path of said transistor.

3. The combination according to claim 2 wherein said voltage-variable capacitor is a varactor diode connected in a series-tuned circuit, series-coupled between said antenna and the emitter of said RF amplifier transistor.